(12) United States Patent
Vogley (10) Patent No.: US 6,260,106 B1
(45) Date of Patent: Jul. 10, 2001

(54) SYNCHRONOUS DATA STORAGE SYSTEM HAVING RE-DRIVE CIRCUITS FOR REDUCED SIGNAL LINE LOADING

(75) Inventor: Wilbur C. Vogley, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/401,444

(22) Filed: Sep. 22, 1999

Related U.S. Application Data
(60) Provisional application No. 60/102,043, filed on Sep. 28, 1998.

(51) Int. Cl.[7] .................................................. G06F 12/00
(52) U.S. Cl. ........................ 711/105; 711/111; 711/163; 711/167; 713/400; 365/233
(58) Field of Search ................................ 711/1, 104, 105, 711/112, 163, 167; 713/400; 365/233

Primary Examiner—Matthew Kim
Assistant Examiner—Fred F. Tzeng
(74) Attorney, Agent, or Firm—Wade James Brady, III; Frederick J. Telecky, Jr.

(57) ABSTRACT

A packet-based data storage system (400) includes a controller (402) and a number of packet-based data storage modules (404-0 to 404-n). The data storage modules (404-0 to 404-n) receive command/address information and a command clock on module command links (412-0 to 412-n) and provide access to storage locations by way of module data links (416-0 to 416-n). The controller (402) issues command/address information and a command clock signal on a controller command link (406). Data is passed to and from the controller (402) by a controller data link (408). Load protection is provided to the controller (402) and the storage modules (404-0 to 404-n) by command re-drive circuits (410-0 to 410-n), coupled between the controller command link (406) and the module command links (412-0 to 412-n), and data re-drive circuits (414-0 to 414-n) coupled between the controller data link (408) and the module data links (416-0 to 416-n).

11 Claims, 5 Drawing Sheets

SYNCHRONOUS DATA STORAGE SYSTEM HAVING RE-DRIVE CIRCUITS FOR REDUCED SIGNAL LINE LOADING

This application claims priority under 35 USC §1119(e)(1) of provisional application No. 60/102,043 filed Sep. 28, 1998.

TECHNICAL FIELD

The present invention relates generally to data storage systems, and more particularly to synchronous data storage systems that access data by application of command and address information packets.

BACKGROUND OF THE INVENTION

The increasing computing power of electronic systems has given rise the need for data storage systems (such as a system random access memory (RAM)) of increased data bandwidth. One way to address this need is to utilize data storage systems that employ synchronous memory devices. Synchronous memory devices, such as synchronous dynamic RAMs (SDRAMs) can provide pipeline data accesses that can include bursts of data, thereby increasing the overall rate at which data can be read from, or written into a data storage system, thereby increasing the overall data bandwidth of the system.

While the use of synchronous memory devices can improve data access rates, there still remains a need for systems that can provide even greater data bandwidths. At the cost of utilizing a more complex controller, one way to further improve the data bandwidth of a system, is to employ a packet-based data storage system. Packet-based data storage systems utilize command and address "packets" of information that are transmitted by a controller to one or more packet-based data storage devices. With the appropriate use of command and address packets, the amount of time a data bus is idle can be minimized, and can thereby increase data bandwidth even more.

Figure 1:
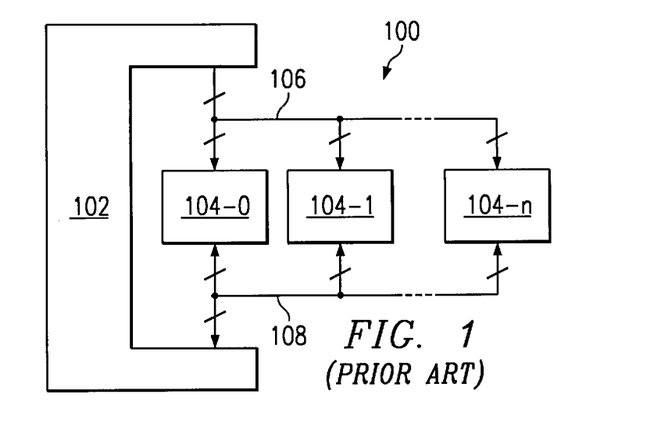
FIG. 1 is a block diagram of a prior art packet-based data storage system.

An example of a prior art packet-based data storage system is set forth in FIG. 1 and designated by the general reference character 100. The data storage system 100 is shown to include a controller 102 coupled to a number of data storage modules 104-0 to 104-n. The controller 102 issues command and address data packets to the storage modules (104-0 to 104-n) by way of a command link 106. Data are written to, and read from the storage modules (104-0 to 104-n) by way of a data link 108. In the particular arrangement of FIG. 1, the command link 106 is a one-way link, while the data link is a two-way link.

To synchronize timing between the controller 102 and its associated storage modules (104-0 to 104-n), the command link 106 can include a command clock which will indicate to the storage modules (104-0 to 104-n) when to latch command and address information. Similarly, the data link 108 can include a data clock which indicates when read data can be latched by the controller 102, and when write data can be latched by a given storage module (104-0 to 104-n).

The storage modules (104-0 to 104-n) can each include a specialized memory device, such as a dynamic RAM (DRAM) that includes the necessary circuits for interpreting command and address packets and issuing data and data clock signals. Alternatively, the storage modules (104-0 to 104-n) can have a "deeper" arrangement, and include multiple memory devices arranged in parallel and/or in series.

Figure 2:
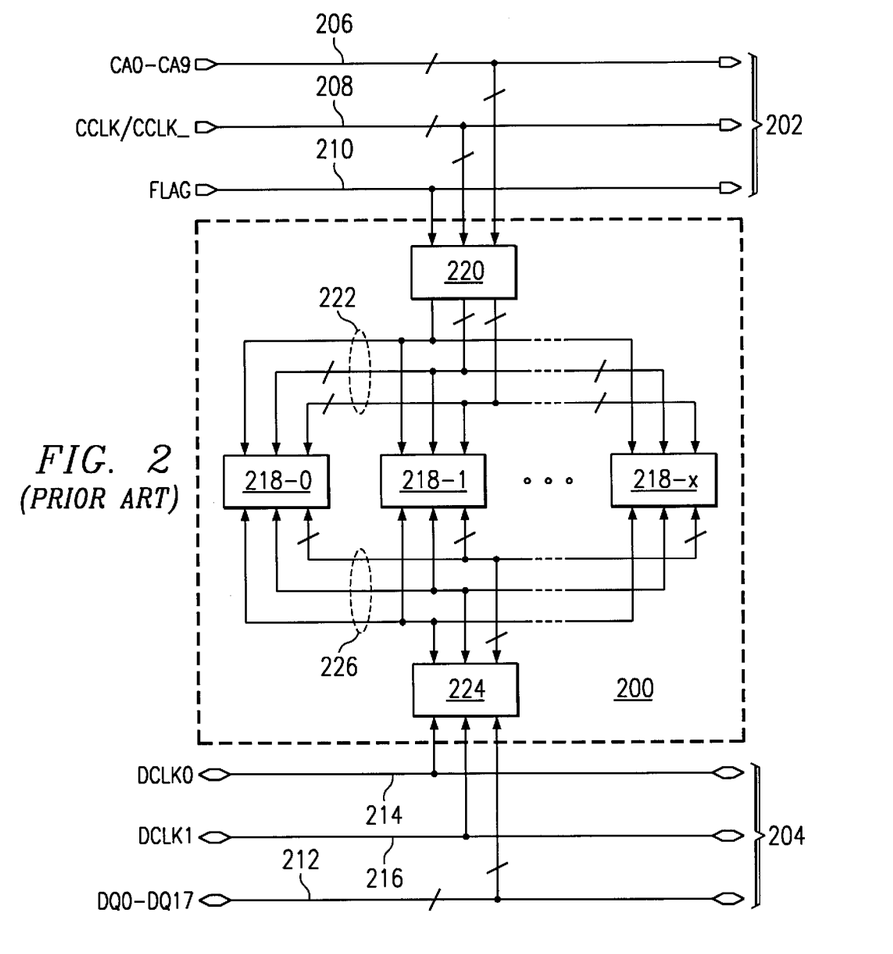
FIG. 2 is a block diagram of a prior art "deep" data storage module.

An example of a deeper storage module is set forth in FIG. 2. The storage module is designated by the general reference character 200, and is shown to be coupled to a command link 202 and a data link 204. The command link 202 includes a command address bus 206, a command clock bus 208, and a flag line 210. The command address bus 206, in the particular arrangement of FIG. 2, carries command address signals CA0–CA9. In addition, the command clock bus 208 carries complementary command clock signals CCLK and CCLK_, and the flag line 210 that carries a flag signal FLAG. The CA0–CA9 signals and FLAG signal are intended to be synchronous with the CCLK/CCLK_ signals. The signals on the command link 202 are unidirectional, being transmitted from a controller to the data storage module 200.

The data link 204 of the particular example set forth in FIG. 2 consists of a data bus 212 that carries signals DQ0–DQ17, an even data clock line 214 that carries an even data clock signal DCLK0, and an odd data clock line 216 that carries an odd data clock signal DCLK1. The signals on the data link 204 are bi-directional, being transmitted from a controller to the storage module 200, or from the storage module 200 to the controller. Data on the data bus 212 are intended to be synchronous with the DCLK0 or DCLK1 signals, and will enable the storage module 200 to latch write data, or enable the controller to latch read data.

The storage module 200 can be considered "deeper" in that it includes a number of packet-based semiconductor memory devices 218-0 to 218-x arranged in parallel. The storage module 200 includes a command address buffer 220 that receives the CCLK/CCLK_, CA0–CA9, and FLAG signals from the command link 202. The command address buffer 220 drives the received signals on an internal module data link 222 that is commonly coupled to the memory devices (218-0 to 218-x). The storage module 200 also includes a data buffer 224 that is connected between the data link 204 and an internal module data link 226. The module data link 226 is commonly connected to the memory devices (218-0 to 218-x). The data buffer 224 is a two-way buffer, buffering data signals (DQ0–DQ17) and data clock signals (DCLK0 and DCLK1) from the memory devices (218-0 to 218-x) to the controller, as well as from the controller to the memory devices (218-0 to 218-x).

Figure 3A:
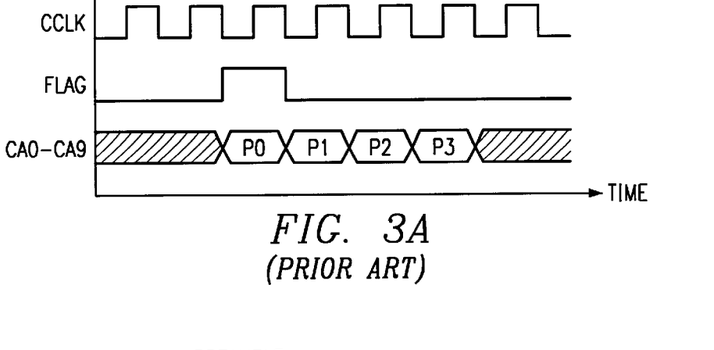
FIGS. 3A and 3B are timing diagrams illustrating idealized command address timing and data timing for the prior art data storage module of FIGS. 2 and 3A and 3B.
Figure 3B:
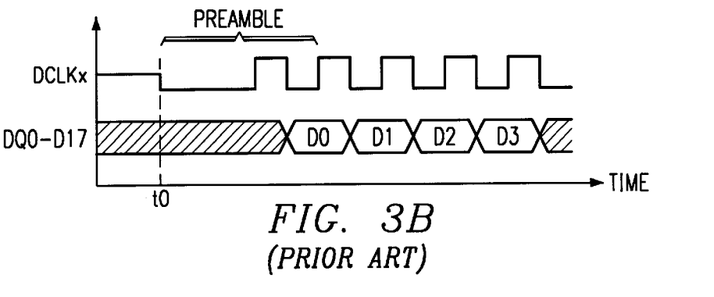

To better understand the timing associated with the prior art packet-based data storage system set forth in FIGS. 1 and 2, two timing diagrams are provided in FIGS. 3A and 3B. FIG. 3A sets forth an idealized version of command/address timing issued from a controller to the data storage module 200. FIG. 3A is shown to include the command clock signal CCLK, the FLAG signal, and the CA0–CA9 signals. The CCLK signal is shown to be a free running periodic clock signal. The FLAG signal is used to indicate that a command address information packet is being transmitted. As shown in FIG. 3A, as the FLAG signal transitions high, the CA0–CA9 signals will present a first packet data field P0. On the subsequent CCLK cycle periods, three more packet data fields (P1–P3) are provided by the CA0–CA9 signals.

FIG. 3B sets forth an idealized version of data timing. Set forth in FIG. 3B is a data clock signal DCLKx and the DATA signals DQ0–DQ17. The DCLKx signal may be either the DCLK0 signal or DCLK1 signal. The data timing set forth in FIG. 3B can be considered to represent a data write operation or a data read operation, as in both cases, data presented on bus DQ0–DQ17 will be accompanied by a DCLKx signal. The DCLKx signal is ideally synchronous with (but not necessarily in exact phase with) the CCLK signal. Prior to time t0, the DCLKx signal is in a high impedance state. Other circuitry on the data bus (not shown) such as termination devices maintain the DCLKx signal at an intermediate logic value.

At time t0, the DCLKx signal begins a "preamble" which precedes the transmission of data on the data bus (DQ0–DQ17). If the preamble is considered in terms of half cycles ("ticks") it is shown to have a value of "00010." Following the preamble, a burst of data (D0–D3) is driven on the data bus (DQ0–DQ17).

A drawback to the prior art approaches set forth and illustrated in FIGS. 1, 2, 3A and 3B, can arise when deeper data storage modules are used in the system. Due to the capacitance and resistance of the controller command link 202 and the module command link 222, command and address information, as well as the command clocks (CCLK/CCLK_), can be degraded. Even the use of a command address buffer 220 and data buffer 224 may still result in signal degradation, as the buffers (220 and 224) can pass on the degraded signals between the storage module 200 and its associated command link 202 and data link 204. This can particularly true if the degradation is an unwanted phase difference between the data signals and their associated data clocks, or between command address information an the associated command clock.

It would be desirable to provide some way of improving the signal integrity between "deep" packet-based data storage modules and their associated controller.

SUMMARY OF THE INVENTION

According to the preferred embodiment, a packet-based data storage system includes at least one data storage module that receives command address information and an associated command clock from a controller by way of a unidirectional command link. In addition, data is transferred between the data storage module and the controller by a bi-directional data link that includes a data bus and a data clock. The preferred embodiment improves signal integrity between the controller and the data storage module by employing "re-drive" circuits that provide load protection for the controller and the data storage module.

In the preferred embodiment, each re-drive circuit receives incoming bus signals in conjunction with a corresponding incoming clock signal. The re-drive circuit, "re-drives" the incoming bus signals on an outgoing bus according to timing established by the incoming clock signal. The re-drive circuit further provides an outgoing clock signal by utilizing the second half of the incoming clock. In this manner, the resulting "re-driven" outgoing clock and bus signals are in the desired phase relationship with one another.

According to one aspect of the present invention, each re-drive circuit includes a gated register that receives the incoming bus signals as inputs, and the incoming clock signal as a control signal.

According to another aspect of the present invention, the packet-based data storage system includes a command re-drive circuit that receives incoming command address bus signals and a command clock from the controller, and provides outgoing command address bus signals and command clock signals to the data storage module.

According to another aspect of the present invention, the packet-based data storage system includes a data re-drive circuit. The data re-drive circuit includes a read data portion that receives incoming data bus signals and a data clock from the data module, and provides outgoing data bus signals and a data clock to the controller. The re-drive circuit further includes a write portion that receives incoming data bus signals and a data clock from the controller, and provides outgoing data bus signals and a data clock to the storage module.

According to another aspect of the present invention, the data re-drive circuit includes a preamble detect portion that senses a preamble in the data clock.

DETAILED DESCRIPTION OF THE EMBODIMENTS

The preferred embodiment is a packet-based data storage system having a controller and a data storage module. Improved load protection for the controller and data storage module are provided by re-drive circuits situated between an incoming bus and clock and an outgoing bus and clock. The preferred embodiment will be described in terms of a block schematic diagram and a series of timing diagrams. Finally, examples of circuit blocks that may be used in the preferred embodiment will be described.

Figure 4:
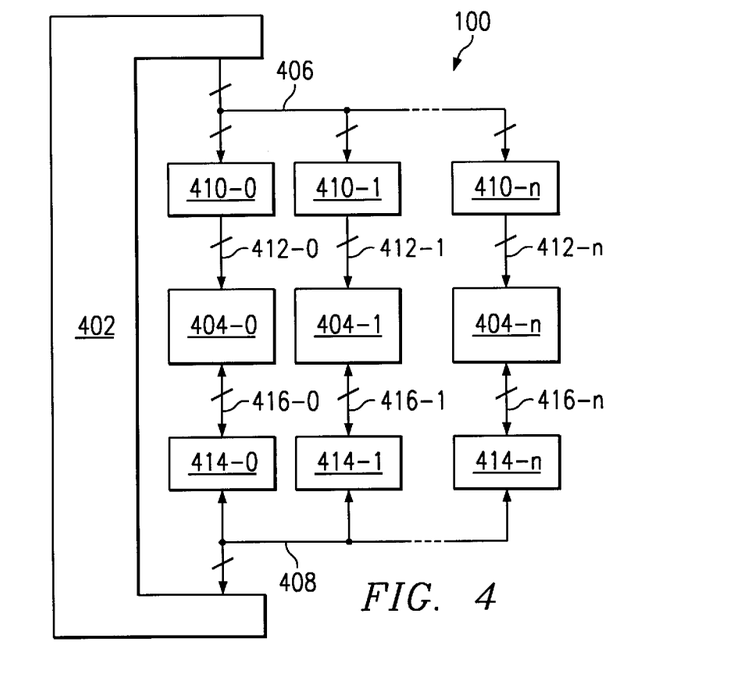
FIG. 4 is a block diagram of the preferred embodiment.

Referring now to FIG. 4, a preferred embodiment is set forth in a block diagram and is designated by the general reference character 400. The preferred embodiment 400 is shown to include a controller 402 and a number of data storage modules 404-0 to 404-n. Command and address information is provided from the controller 402 to the data storage modules (404-0 to 404-n) by a one-way controller command link 406. Data is transmitted between the controller 402 and the data storage modules (404-0 to 404-n) by a two-way controller data link 408.

Unlike prior art packet-based data storage systems, in the preferred embodiment 400, the controller command link 406 is coupled to each data storage module (404-0 to 404-n) by an associated command re-drive circuit 410-0 to 410-n. Thus, in the arrangement of FIG. 4, each data storage module (404-0 to 404-n) can be considered to include a module command link 412-0 to 412-n, that receives command and address information from a corresponding command re-drive circuit 410-0 to 410-n. In addition, the preferred embodiment 400 further includes data re-drive circuits 414-0 to 414-n that couple the command data link 408 to module data links, shown as 416-0 to 416-n. The module data links (416-0 to 416-n) are each coupled to an associated data storage module (404-0 to 404-n).

Figure 5:
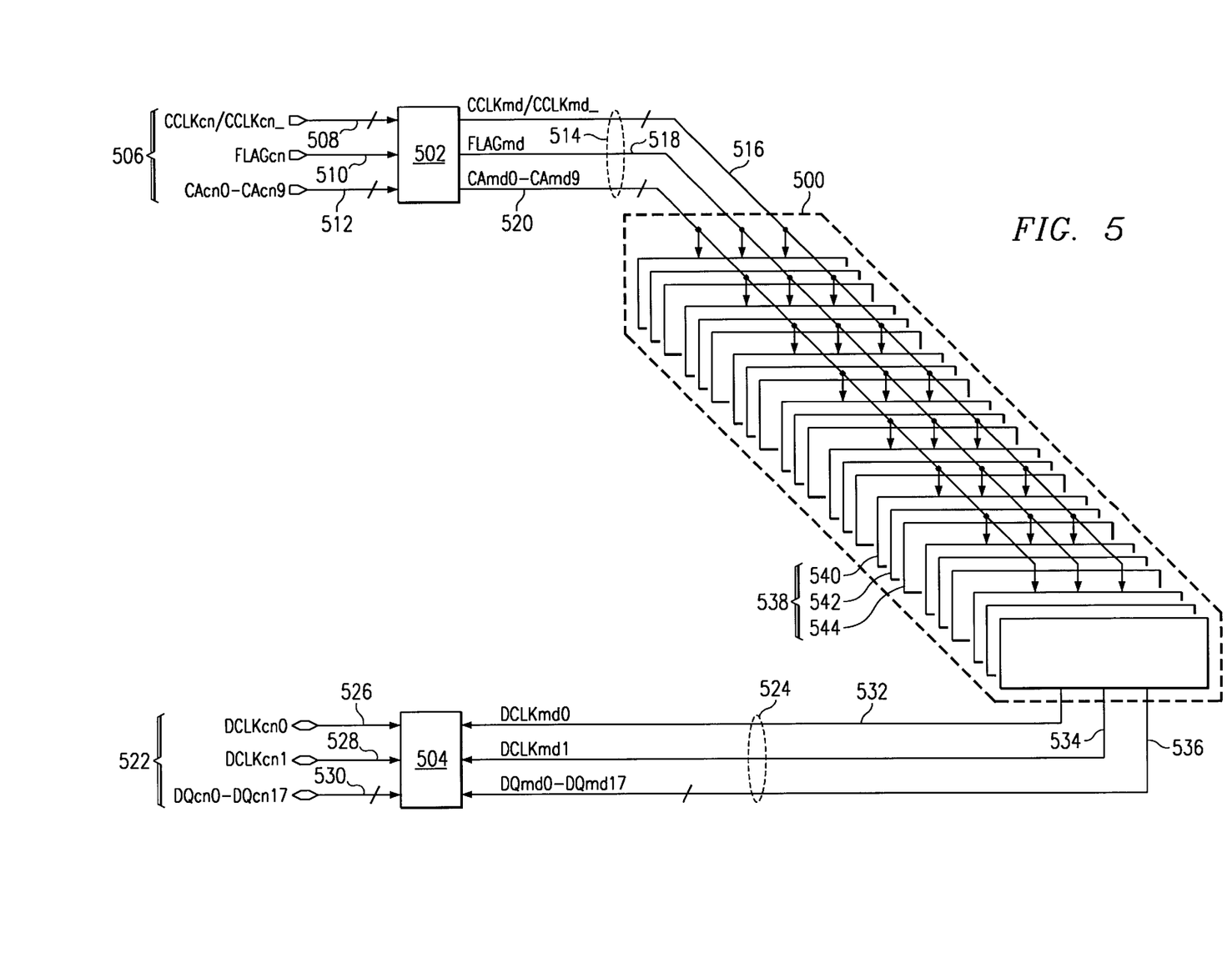
FIG. 5 is a block diagram of a data storage module that may be used in the preferred embodiment of FIG. 4.

Referring now to FIG. 5, a more detailed diagram of a data storage module 500 and its associated command re-drive circuit 502 and data re-drive circuit 504. A controller command link 506 is received by the command re-drive circuit 502, and is shown to include command clock lines 508, a flag line 510, and a command address bus 512. In the preferred embodiment 500, the command clock lines 508 carry complementary command clocks CCLKcn and CCLKcn_ that are generated by a controller. The flag line 510 carries a FLAGcn signal, also generated by the controller. The FLAG signal is synchronous with the CCLKcn/CCLKcn_ signals, and typically indicates the beginning of the transmission of a packet of command and address information. The command address bus 512 carries command and address information (CAcn0–CAcn9) that selects a data storage module 500, and indicates what type of operation is to be performed at which addresses within that data storage module 500. The CAcn0–CAcn9 signals are driven in synchronism with the CCLKcn and CCLKcn_ signals.

A module command link 514 is coupled between the command re-drive circuit 502 and the data storage module 500, and is shown to include module command clock lines 516, that carry complementary module command clock signals CCLKmd/CCLKmd_, a module flag line 518, that carries a module flag signal FLAGmd, and a module command address bus 520, that carries command address data (CAmd0–CAmd9) for the data storage module 500. The signals of the module command link 514 are re-driven versions of the signals on the controller command link 506. That is, the CCLKmd/CCLKmd_, FLAGmd, and CAmd0–CAmd9 signals are driven in response to the CCLKcn/CCLKcn_, FLAGcn, and CAcn0–CAcn9 signals, respectively. The re-drive function of the preferred embodiment command re-drive circuit 502 introduces a half clock cycle (a "tick") delay between the signals on the controller command link 506 their corresponding re-driven signals on the module command link 514. Furthermore, the command re-drive circuit 502 ensures the FLAGmd signal and CAmd0–CAmd9 signals remain in synchronism with their associated clock signals (CCLKmd and CCLKmd_).

In this manner, load protection is provided to the controller, as the controller will only have to drive the controller command link 506 because the controller re-drive circuit 502 will, in turn, drive its associated module command link 506.

Referring once again to FIG. 5, the data re-drive circuit 504 is shown to be coupled to a controller data link 522 on one side, and a module data link 524 on the other side. The controller data link 522 is shown to include an even controller data clock line 526 that carries an even data clock signal DCLKcn0, an odd controller data clock line 528 that carries an odd data clock signal DCLKcn1, and a controller data bus 530 that carries controller data signals DQcn0–DQcn17. The controller data signals (DQcn0–DQcn17) may be read data that is received by the controller, or write data that is transmitted from the controller.

The module data link 524 has lines and signals that correspond to those of the controller data link 522, and includes an even module data clock line 532, that carries an even data clock signal DCLKmd0, an odd module data clock line 534, that carries an odd data clock signal DCLKmd1, and a module data bus 536, that carries module data signals DQmd0–DQmd17. The DCLKmd0, DCLKmd1, and DQmd0–DQmd17 signals correspond to the DCLKcn0, DCLKcn1, and DQcn0–DQcn17 signals, respectively. The module data signals (DQmd0–DQmd17) can be read data output from the data storage module 500 or write data that is to be input to the data storage module 500. The module data signals (DQmd0–DQmd17) are synchronous with either the DCLKmd0 or DCLKmd1 signal, depending upon what portion of the data storage module 500 is being accessed.

Unlike the command re-drive circuit 502, which is unidirectional, the data re-drive circuit 504 is bi-directional. In a write operation, the controller will drive the controller data bus 530 with write data. At the same time, either the even controller data clock line 526 or odd controller data clock line 528 will be driven in synchronism with the write data. The write data on the controller data bus 530 will be gated to the module data bus 530 according to the active controller data clock signal (either DCLKcn0 or DCLKcn1). In addition, the data re-drive circuit 504 will regenerate the active controller data clock signal to generate a corresponding active module data clock signal (either DCLKmd0 or DCLKmd1). The regenerated clock signal will be synchronized with the data that has been gated to the module data bus 536.

In a read operation, the data storage module 500 will drive the module data bus 536, while at the same time, one of the module data clock signals (DCLKmd0, for example) is driven in synchronism with the read data. The data re-drive circuit 504 will then gate the read data to the module data bus 530 according to the DCLKmd0 signal. In addition, the data re-drive circuit 504 will utilize the DCLKmd0 signal to generate a DCLKcn0 signal.

In this manner, load protection is provided to both the controller and the data storage module 500. In a read operation, the data storage module 500 will only have to drive the module data link 524 as the data re-drive circuit 504 will drive the controller data link 522. Similarly, in a write operation, the controller will only have to drive the controller data link 522 while the data re-drive circuit 504 will drive the module data link 524.

The particular data storage module 500 of FIG. 5 is shown to include a number of packet-based memory devices arranged in parallel. One of the memory devices is designated by the reference character 538, and is shown to include an input/output (I/O) portion 540, an even array portion 542 and an odd array portion 544. The I/O portion 540 of each memory device 538 is coupled to the module command link 514 and the module data link 524. The even array portions 542 are accessed in synchronism with the even module data clock signal DCLKmd0, odd array portions 544 are accessed in synchronism with the odd module data clock signal DCLKmd1. While different sorts of memory devices could be utilized, the use of packet-based dynamic random access memories (DRAMs) can be particularly advantageous in terms of data storage system size, cost, and power consumption.

Figure 6A:
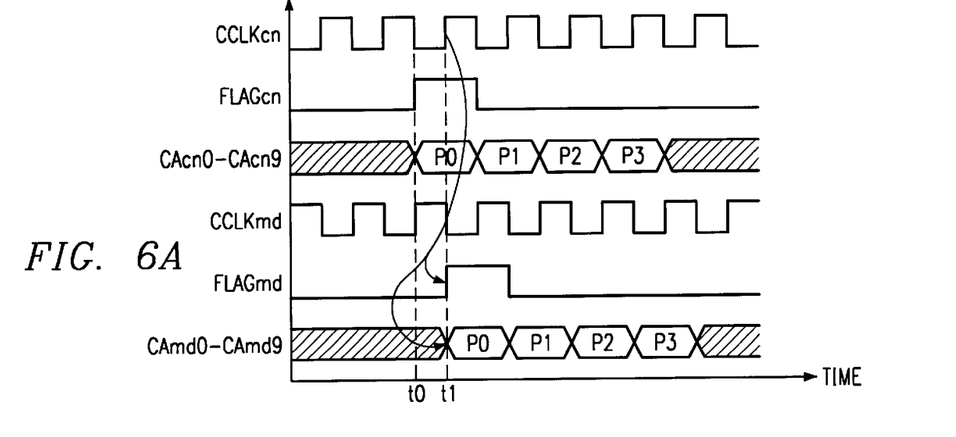
FIGS. 6A–6C are timing diagrams illustrating command address timing, read data timing and write data timing according to the preferred embodiment.
Figure 6B:
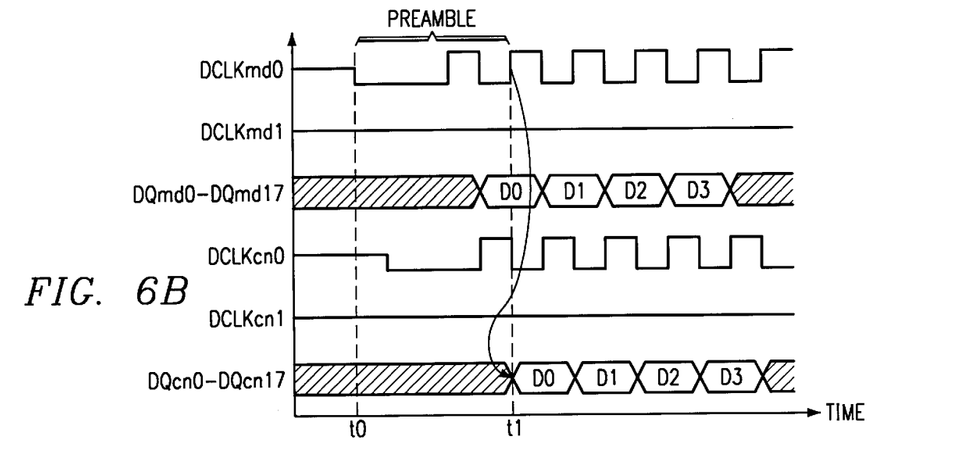
Figure 6C:
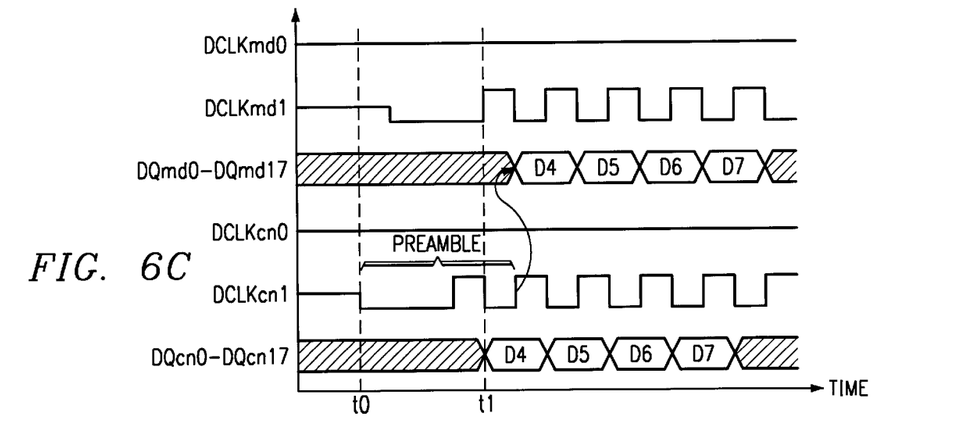

To better understand the operation of the preferred embodiment, a series of timing diagrams are set forth in FIGS. 6A to 6C illustrating various data access operations. FIG. 6A illustrates the timing involved in the application of command and address information from the controller to a data storage module. FIG. 6A includes a command clock (CCLKcn) from a controller, a flag signal (FLAGcn) from a controller, and command address information (CAcn0–CAcn9) issued from the controller. In addition, the resulting signals generated by the command re-drive circuit 502 are also set forth, and include the CCLKmd, FLAGmd and CAmd0–CAmd9 signals.

At time t0, the FLAGcn signal transitions high indicating the beginning of the transmission of a command address packet from the controller.

At time t1, on the rising edge of the CCLKcn signal, the high FLAGcn value on the controller command link is gated by the high transition in the CCLKcn signal to the module command link, generating a high FLAGmd signal. In a similar fashion, as packet values (P0–P3) are driven on the controller command link (CAcn0–CAcn9), the accompanying high transitions in the CCLKcn signal will gate the packet values (P0–P3) to the module command bus link (CAmd0–CAmd9). Thus, as shown in FIG. 6A, at time t1 the P0 packet portion on bus CAcn0–CAcn9 is gated by the high-going CCLKcn signal to generate the P0 packet portion on bus CAmd0–CAmd9. This operation introduces approximately a one tick delay between the signals on the controller command link (CCLKcn, FLAGcn, and CAcn0–CAcn9) and their associated module command link signals (CCLKmd, FLAGmd, and CAmd0–CAmd9). The value of "approximately" is used as the packet values (P0–P3) do not have to be exactly aligned with the CCLKcn signal as shown in FIG. 6A. All that is necessary is the the proper packet value be present on the controller command link when it is gated to the module command link by the CCLKcn signal.

It is noted that the command clock signal (CCLKmd) on the module link is generated by using the second half of the CCLKcn signal. Thus, the CCLKmd signal of FIG. 6A is shown to be shifted by approximately 180 degrees with respect to the CCLKcn signal. This arrangement results in the FLAGcn signal and packet values (P0–P3) being centered with the high-going transitions of the CCLKmd signal. In this manner, a phase relationship is maintained between the packet values (P0–P3) and the CCLKmd signal.

Referring now to FIG. 6B a timing diagram is set forth illustrating a read operation of the preferred embodiment. FIG. 6B includes the even and odd module data clock signals (DCLKmd0 and DCLKmd1) and the module data bus values (DQmd0–DQmd17). The resulting controller data link response is set forth, and includes the even and odd controller data clock signals (DCLKcn0 and DCLKcn1) and the controller data bus values (DQcn0–DQcn17). The example of FIG. 6B illustrates a read operation from the even bank portion of a data storage module, therefore the DCLKmd0 and DCLKcn0 signals will be active, while the DCLKmd1 and DCLKcn1 signals remain in a high impedance state.

At time t0, in response to an applied command address packet, the accessed data storage module begins providing read data by generating a "preamble" on the DCLKmd0 signal line. The preamble provides an indication to the packet-based data storage system that data is to follow. When considered in terms of "ticks" (i.e., half cycles of the CCLKmd0 signal), the preamble is shown to have a value of "00010." The data re-drive circuit of the preferred embodiment detects the preamble and locks the re-drive circuit to receive input data.

At time t1, the preamble is concluded, and as the DCLKmd0 signal transitions high. At the same time, a first data value D0 is present on data bus DQmd0–DQmd17. In response to the high DCLKmd0 value, the data re-drive circuit gates the D0 value to the controller data bus DQcn0–DQcn17. This same general process is repeated with the DCLKmd0 signal gating the remaining data values D1–D3 to the controller data bus DQcn0–DQcn17.

The DCLKmd0 signal is also used to generate the DCLKcn0 signal. In the particular arrangement of FIG. 6B, the preamble is gated through, delayed by one tick, to generate a preamble in the DCLKcn0 signal. The second half of the DCLKmd0 signal can be used to generate the DCLKcn0 signal, resulting in the DCLKmd0 signal being "centered" with the resulting data values (D0–D3) on the bus DQcn0–DQcn17. In this manner, a phase relationship is maintained between the data values (D0–D3) and the DCLKcn0 signal.

Referring now to FIG. 6C a write operation is illustrated by a timing diagram. FIG. 6C includes the same signals as set forth in FIG. 6B. However, the write operation is to the odd portion of a storage device, therefore the DCLKcn1 and DCLKmd1 signals will be active and the DCLKcn0 and DCLKmd0 signals will remain in a high impedance state.

The write operation begins with a controller sending a write operation packet to a data module. Prior to driving the DQcn0–DQcn17 bus with write data, a preamble is generated on the data clock corresponding to the data module region where the write is to take place. Thus, in the particular example of FIG. 6C, a 00010 tick preamble is generated on the DCLKcn1 signal at time t0.

At time t1, the preamble concludes and the DCLKcn1 signal transitions high while the first write data (D4) appears on the controller data link bus DQcn0–DQcn17. The DCLKcn1 signal is used to gate the D4 value to the module data bus DQmd0–DQmd17. Consecutive transitions in the DCLKcn1 signals are used to gate the remaining data (D5–D7) of the data burst to bus DQmd0–DQmd17. The DCLKcn1 signal is also used to generate a DCLKmd1 signal that is aligned in phase with the gated data signals (D4–D7) on bus DQmd0–DQmdl7.

In this manner, load protection is provided to the controller and data storage devices of a packet-based data storage system by employing re-drive circuits.

Figure 7:
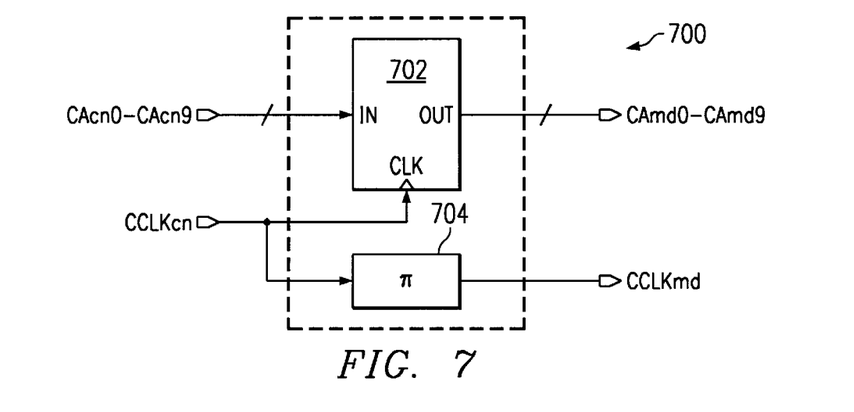
FIG. 7 is a block schematic diagram illustrating a command address re-drive circuit that may be used in the preferred embodiment.

Referring now to FIG. 7, a block schematic diagram is set forth illustrating a command re-drive circuit that may be used in the preferred embodiment. It is understood that the FIG. 7 represents just one possible command pre-drive circuit and so should not be construed as limiting the present invention to such a configuration. The command pre-drive circuit is designated by the general reference character 700 and is shown to include a gated register 702 and a clock regeneration circuit 704. The gated register circuit 702 includes an input that receives the command address signals (CAcn0–CAcn9) from a controller and an output that provides command address signals (CAmd0–CAmd9) to a data storage module. The gated register 702 further includes a clock input that receives a CCLKcn signal. When the CCLKcn signal is high, the current register input (CAcn0–CAcn9) value is latched by the gated register 702 and provided as the register output (CAmd0–CAmd9). The use of a gated register circuit 702 to accomplish the command address re-drive function can be particularly advantageous as it is a relatively simple circuit, and so is more easily integrated into existing packet-based data storage systems.

The clock regeneration circuit 704 of the particular command re-drive circuit of FIG. 7 receives the CCLKcn signal, and regenerates it by driving the CCLKcn signal with a 180 degree phase shift to generate the CCLKmd signal.

Figure 8:
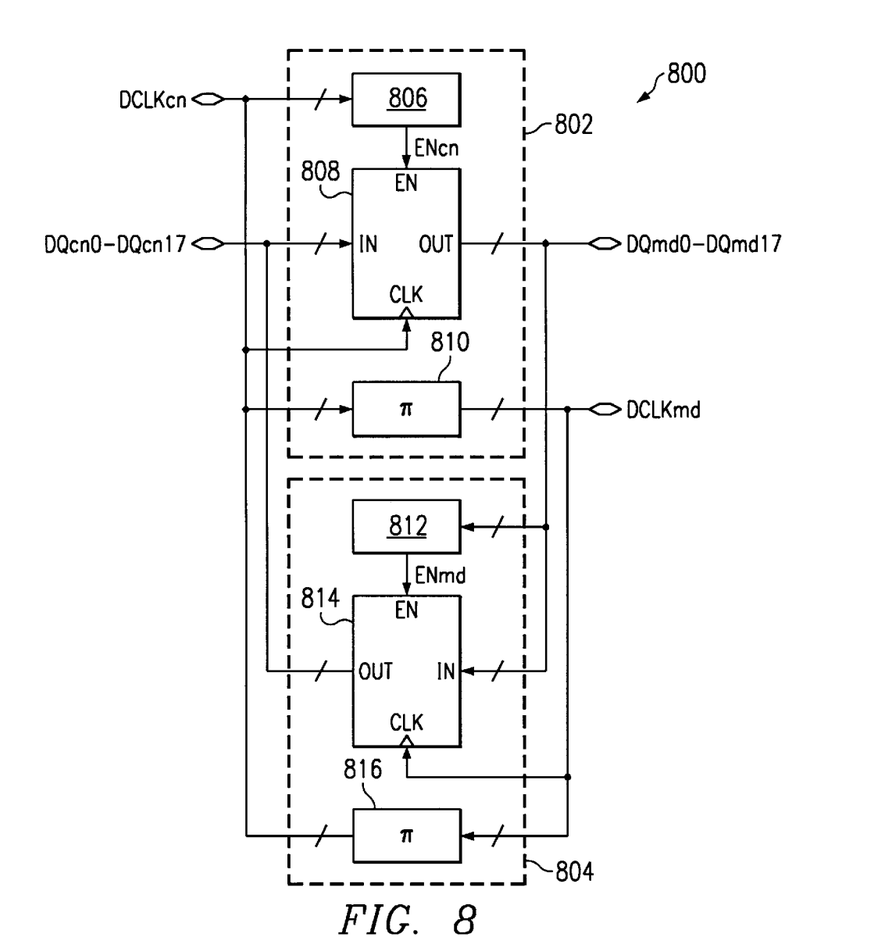
FIG. 8 is a block schematic diagram illustrating a data re-drive circuit that may be used in the preferred embodiment.

Referring now to FIG. 8, a block schematic diagram is set forth illustrating a data re-drive circuit that may be used in the preferred embodiment. It is understood, that like the command re-drive circuit of FIG. 7, the circuit of FIG. 8 represents just one possible data pre-drive circuit and so should not be construed as limiting to the present invention. The data pre-drive circuit is designated by the general reference character 800 and is shown to include a write portion 802 and a read portion 804.

The write portion 802 is shown to include a first preamble detect circuit 806, a first gated register circuit 808 that is capable of being disabled, and a first clock regenerator circuit 810. The first preamble detect circuit 806 receives the DCLKcn signal (which may be the DCLKcn0 or DCLKcn1 signal). Upon detecting a preamble (such as the 00010 tick preamble described above) in the DCLKcn signal, the first preamble detect circuit 806 activates a first register enable signal ENcn. The first gated register 808 includes an input that receives the controller data bus signals DQcn0–DQcn17 and an output that provides the module data bus signals DQmd0–DQmd17. The first gated register 808 further includes an enable input that receives the ENcn signal and a clock input that receives the DCLKcn signal. When the signal at the enable input is inactive (no preamble received from the controller data clocks), the first gated register 808 is disabled. When the enable signal is active (preamble received from a controller data clock), the first gated register 808, upon receiving a high DCLKcn signal, will latch the current register input (DQcn0–DQcn17) and provided it as the register output (DQmd0–DQmd17).

The first clock regenerator 810 receives the DCLKcn and provides a DCLKmd signal (which can be DCLKmd0 or DCLKmd1). The first clock regenerator 810 ensures that the DCLKmd signal is in proper phase with the DQmd0–DQmd17 data values. In the particular arrangement of FIG. 8, the first clock regenerator 810 provides the DCLKmd signal by shifting the DCLKcn signal by 180 degrees. In addition, the first clock regenerator 810 is tri-statable, being capable of providing a high impedance output (DCLKmd) when its associated input (DCLKcn) is in a high impedance state.

The read portion 804 is similar to the write portion 802 but arranged so as to re-drive signals from a module data link (DCLKmd and DQmd0–DQmd17) on the controller data link (DCLKcn and DQcn0–DQcn17). Thus, the read portion 804 includes a second preamble detect circuit 812, a second gated register circuit 814, and a second clock regenerator circuit 816. The second preamble detect circuit 812 is similar to the first preamble detect circuit 806, but detects a preamble on the DCLKmd signal, and provides a second register enable signal ENmd. The second gated register circuit 814 is like the first gated register circuit 808, but receives the module data bus signals DQmd0–DQmd17 as an input, and provides the DQcn0–DQcn17 signals as an output. The enable input of the second gated register circuit 814 receives the ENmd signal and the clock input that receives the DCLKmd signal. The second clock regenerator 816 is like the first clock regenerator circuit 810, but generates the DCLKcn signal from the DCLKmd signal.

As in the case of the command re-drive circuit of FIG. 7, the use of first and second gated registers (808 and 814) in the data re-drive circuit is advantageous as the circuits provide a simple solution to the load protection problem.

It is understood that while the present invention has been described in detail, various changes, substitutions, and alterations could be made without departing from the spirit and scope of the invention as defined by the appended claims.

What is claimed is:

1. A data storage system, comprising:
 a controller command link that includes a controller command address bus and a controller command clock line, the controller command address bus receiving command and address information in synchronism with a controller command clock signal on the controller command clock line;
 a module command link that includes a module command address bus and a module command clock line;
 a data storage module that includes a plurality of data storage locations and provides access to selected data storage locations according to command and address information on the module command link; and
 a command re-drive circuit coupled between the controller command link and the module command link, the command re-drive circuit gating command and address information on the controller command address bus to the module command address bus according to the controller command clock signal, and generating a module command clock signal on the module command clock line in response to the controller command clock signal, the module command clock signal being in synchronism and having a predetermined phase relationship with the command address information that is gated to the module command address bus.

2. The data storage system of claim 1, wherein:
 the data storage module includes a plurality of data storage devices in parallel.

3. The data storage system of claim 2, wherein:
 the data storage devices are synchronous dynamic random access memory (SDRAM) devices.

4. The data storage system of claim 1, wherein:
 the command re-drive circuit includes a gated register circuit having an input coupled to the controller command address bus, an output coupled to the module command address bus, and a gate control input coupled to the controller command clock line.

5. The data storage system of claim 1, wherein:
 the controller command clock signal is a periodic waveform, and the module command clock signal is shifted by approximately 180 degrees with respect to the controller command clock signal.

6. A data storage system, comprising:
 a controller data link that includes a controller data bus and at least one controller data clock line;
 a module data link that includes a module data bus and at least one data clock line;
 a data storage module that includes a plurality of data storage locations and provides access to selected data storage locations by way of the module data bus; and
 a data re-drive circuit coupled between the controller data link and the module data link,
  in a first type of operation, the data re-drive circuit gating data on the controller data bus to the module data bus according to a controller data clock signal on the at least one controller data clock line, and generating a module data clock signal on the at least one module data clock line in response to the controller data clock signal, the module data clock signal being in synchronism and having a predetermined phase relationship with the data that is gated onto the module data bus, and
  in a second type of operation, the data re-drive circuit gating data on the module data bus to the controller data bus according to a module data clock signal on the at least one module data clock line, and generating a controller data clock signal on the at least one controller data clock line in response to the module data clock signal, the controller data clock signal being in synchronism and having a predetermined phase relationship with the data gated onto the controller data bus.

7. The data storage system of claim 6, wherein:
 the data storage module includes a plurality of data storage devices in parallel.

8. The data storage system of claim 7, wherein:

the controller data link includes an even controller data clock line and an odd controller data clock line;

the module data link includes an even module data clock line and an odd module data clock line;

the data storage devices include even portions and odd portions, and provide access to selected even portions when the even module data clock line is driven with an even module data clock signal, and provide access to selected odd portions when the odd module data clock line is driven with an odd module data clock signal.

9. The data storage system of claim 6, wherein:

the data re-drive circuit includes a first mode gated register circuit having an input coupled to the controller data bus, an output coupled to the module data bus, and a gate control input coupled to the at least one controller data clock line.

10. The data storage system of claim 6, wherein:

the data re-drive circuit includes a second mode gated register circuit having an input coupled to the module data bus, an output coupled to the controller data bus, and a gate control input coupled to the at least one module data clock line.

11. The data storage system of claim 6, wherein:

the controller data clock signal includes a periodic waveform and the module data clock signal is shifted by approximately 180 degrees with respect to the controller data clock signal.

* * * * *